United States Patent
Yang et al.

(10) Patent No.: US 10,431,494 B2
(45) Date of Patent: Oct. 1, 2019

(54) BEOL SELF-ALIGNED INTERCONNECT STRUCTURE

(71) Applicant: International Business Machines Corporation, Armonk, NY (US)

(72) Inventors: Chih-Chao Yang, Glenmont, NY (US); Lawrence A. Clevenger, Saratoga Springs, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/882,545

(22) Filed: Jan. 29, 2018

(65) Prior Publication Data

US 2019/0237366 A1    Aug. 1, 2019

(51) Int. Cl.
*H01L 21/768* (2006.01)
*H01L 23/522* (2006.01)
*H01L 23/532* (2006.01)

(52) U.S. Cl.
CPC .. *H01L 21/76897* (2013.01); *H01L 21/76807* (2013.01); *H01L 21/76834* (2013.01); *H01L 21/76849* (2013.01); *H01L 21/76877* (2013.01); *H01L 23/5226* (2013.01); *H01L 23/5228* (2013.01); *H01L 23/53209* (2013.01); *H01L 23/53242* (2013.01); *H01L 23/53257* (2013.01); *H01L 23/53295* (2013.01)

(58) Field of Classification Search
CPC ............. H01L 23/5226; H01L 23/5228; H01L 23/53209; H01L 23/53242; H01L 23/53257; H01L 23/53295; H01L 21/76897; H01L 21/76849; H01L 21/76877; H01L 21/76807; H01L 21/76834
USPC ............... 257/751, 756, 758, 762, 769, 774, 257/E23.145, E23.161, E23.167, E21.17, 257/E21.171, E21.174, E21.579, E21.582, 257/E21.591; 438/622, 627, 633, 654, 438/687, 700
See application file for complete search history.

(56) References Cited

U.S. PATENT DOCUMENTS

| | | |
|---|---|---|
| 5,891,513 A | 4/1999 | Dubin et al. |
| 6,143,645 A | 11/2000 | Hsu et al. |
| 6,187,672 B1 * | 2/2001 | Zhao ............ H01L 21/76801 257/E21.576 |
| 6,384,486 B2 * | 5/2002 | Zuniga ............... H01L 24/03 257/780 |
| 6,713,835 B1 * | 3/2004 | Horak ............ H01L 21/7682 257/522 |
| 7,086,138 B2 | 8/2006 | Anderson |
| 7,514,361 B2 | 4/2009 | Bonilla et al. |
| 7,727,888 B2 | 6/2010 | Yang et al. |
| 7,745,282 B2 | 6/2010 | Yang et al. |

(Continued)

*Primary Examiner* — Dao H Nguyen
(74) *Attorney, Agent, or Firm* — Scully, Scott, Murphy & Presser, P.C.; L. Jeffrey Kelly, Esq.

(57) ABSTRACT

An interconnect structure is provided that includes an interconnect level that contains an interconnect dielectric material layer having a first electrically conductive via feature, an electrically conductive line feature, and a second electrically conductive via feature embedded in the interconnect dielectric material layer, wherein the first and second via features are self-aligned perpendicularly to, and along the direction of, the electrically conductive line feature.

18 Claims, 6 Drawing Sheets

(56) References Cited

U.S. PATENT DOCUMENTS

| | | |
|---|---|---|
| 8,039,966 B2 | 10/2011 | Yang et al. |
| 8,138,604 B2 | 3/2012 | Yang et al. |
| 8,299,625 B2 | 10/2012 | Ponoth et al. |
| 8,310,056 B2 * | 11/2012 | Oda .................... H01L 23/5329 257/758 |
| 9,793,156 B1 * | 10/2017 | Yang ................. H01L 21/76816 |
| 2001/0008311 A1 * | 7/2001 | Harada ................... H01L 24/03 257/758 |
| 2001/0023099 A1 * | 9/2001 | Saito ................ H01L 21/76801 438/241 |
| 2002/0013026 A1 * | 1/2002 | Iwasa ................ H01L 27/10852 438/239 |
| 2002/0121699 A1 | 9/2002 | Cheng et al. |
| 2005/0116348 A1 * | 6/2005 | Minamihaba ....... H01L 23/5222 257/758 |
| 2011/0097895 A1 * | 4/2011 | Hong ................ H01L 21/76816 438/627 |

\* cited by examiner

BEOL SELF-ALIGNED INTERCONNECT STRUCTURE

BACKGROUND

The present application relates to a back-end-of-the-line (BEOL) interconnect structure and a method of forming the same. More particularly, the present application relates to an interconnect structure containing an interconnect level that contains an interconnect dielectric material layer having a first electrically conductive via feature, an electrically conductive line feature, and a second electrically conductive via feature embedded in the interconnect dielectric material layer, wherein the first and second via features are self-aligned perpendicularly to, and along the direction of, the electrically conductive line feature.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures.

Within typical dual damascene interconnect structures, electrically conductive metal vias run perpendicular to the semiconductor substrate and electrically conductive metal lines run parallel to the semiconductor substrate. Typically, the electrically conductive metal vias are present beneath the electrically conductive metal lines and both features are embedded within an interconnect dielectric material layer.

For a conventional self-aligned via process with a trench first metal hard mask integration scheme used in providing dual damascene interconnect structures, the vias are self-aligned perpendicular to the line (i.e., trench) direction, but not self-aligned along the line (i.e., trench) direction. This may cause potential via and line shorting problems. Also, an uncontrolled via chamfer may increase the risk of via to metal shorting, which, in turn, may result in poor electrical yield and low reliability.

SUMMARY

The present application provides an interconnect structure that includes an interconnect level that contains an interconnect dielectric material layer having a first electrically conductive via feature, an electrically conductive line feature, and a second electrically conductive via feature embedded in the interconnect dielectric material layer, wherein the first and second via features are self-aligned perpendicularly to, and along the direction of, the electrically conductive line feature.

In one aspect of the present application, an interconnect structure is provided. In one embodiment, the interconnect structure may include a lower interconnect level including a first interconnect dielectric material layer having a first electrically conductive line feature embedded therein. The structure further includes an upper interconnect level located above the lower interconnect level and including a second interconnect dielectric material layer having a first electrically conductive via feature, a second electrically conductive line feature, and a second electrically conductive via feature stacked one atop the other, and embedded in the second interconnect dielectric material layer, wherein the first and second electrically conductive via features are self-aligned perpendicularly to, and along the direction of, the second electrically conductive line feature. A third interconnect dielectric material layer is present that has a lower portion embedded in the second interconnect dielectric material layer and laterally adjacent the second electrically conductive via feature, and an upper portion that is located above the second interconnect dielectric material layer and the second electrically conductive via feature.

In another aspect of the present application, a method of forming an interconnect structure is provided. In one embodiment, the method may include forming a lower interconnect level including a first interconnect dielectric material layer having a first electrically conductive line feature embedded therein. Next, an upper interconnect level is formed above the lower interconnect level. The upper interconnect level includes a second interconnect dielectric material layer having a first electrically conductive via feature, a second electrically conductive line feature, and a second electrically conductive via feature stacked one atop the other, and embedded in the second interconnect dielectric material layer, wherein the first and second electrically conductive via features are self-aligned perpendicularly to, and along the direction of, the second electrically conductive line feature. Next, a third interconnect dielectric material layer is formed having a lower portion embedded in the second interconnect dielectric material layer and laterally adjacent the second electrically conductive via feature, and an upper portion that is located above the second interconnect dielectric material layer and the second electrically conductive via feature.

DETAILED DESCRIPTION

Figure 1:
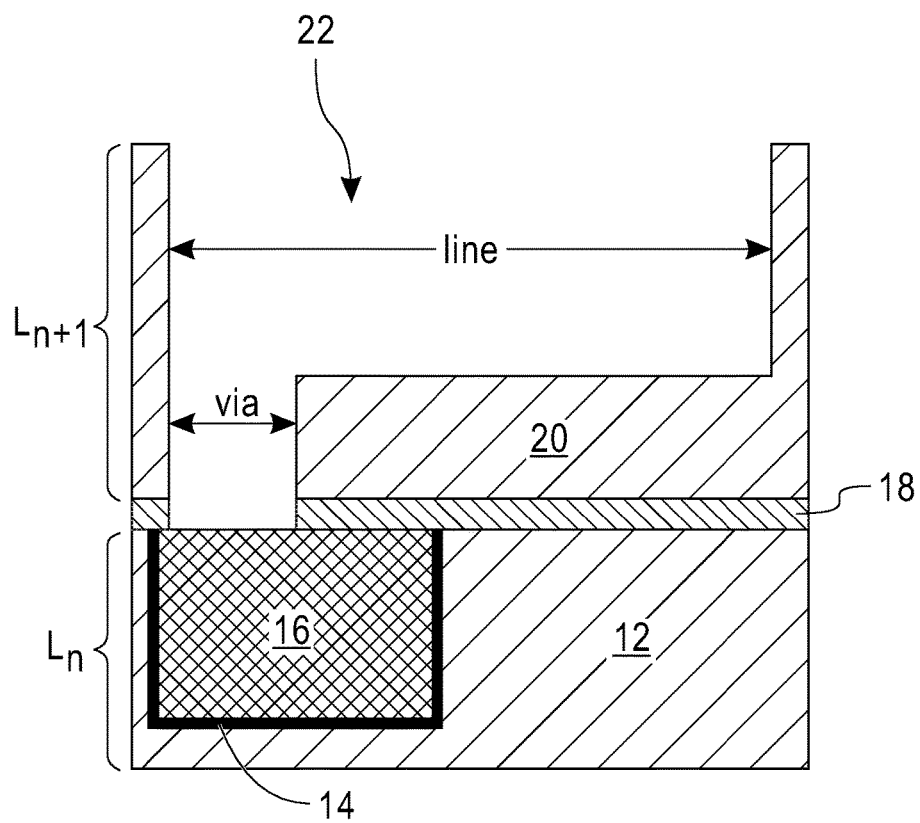
FIG. 1 is a cross sectional view of an exemplary semiconductor structure during an early stage of fabrication and including a second interconnect dielectric material layer having a combined via/line opening formed therein and located above a lower interconnect level that includes a first electrically conductive structure embedded in a first interconnect dielectric material layer in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure of the present application during an early stage of fabrication. As is shown, the exemplary semiconductor structure of FIG. 1 includes a second interconnect dielectric material layer 20 having a combined via/line opening 22 formed therein and located above a lower interconnect level, $L_n$. The second interconnect dielectric material layer 20 is a component of an upper interconnect level, $L_{n+1}$. In some embodiments, and as illustrated, a capping layer 18 may be positioned between the lower interconnect level, $L_n$, and the upper interconnect level, $L_{n+1}$. In some embodiments, capping layer 18 is omitted.

The lower interconnect level, $L_n$, includes a first interconnect dielectric material layer 12 that includes at least one electrically conductive structure 16 embedded therein. A first diffusion barrier liner 14 may also present that surrounds the sidewalls and the bottom wall (i.e., bottommost surface) of the at least one first electrically conductive structure 16 which is embedded in the first interconnect dielectric material layer 12. As is shown, the first electrically conductive structure 16 and the first diffusion barrier liner 14 have topmost surfaces that are coplanar with each other as well as coplanar with a topmost surface of the first interconnect dielectric material layer 12. In some embodiments, the first diffusion barrier liner 14 may be omitted from the lower interconnect level, $L_n$.

The first interconnect dielectric material layer 12 of the lower interconnect level, $L_n$, may be composed of an inorganic dielectric material or an organic dielectric material. In some embodiments, the first interconnect dielectric material layer 12 may be porous. In other embodiments, the first interconnect dielectric material layer 12 may be non-porous. Examples of suitable dielectric materials that may be employed as the first interconnect dielectric material layer 12 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first interconnect dielectric material layer 12 may have a dielectric constant (all dielectric constants mentioned herein are measured relative to a vacuum, unless otherwise stated) that is about 4.0 or less. In one embodiment, the first interconnect dielectric material layer 12 has a dielectric constant of 2.8 or less. These dielectrics generally having a lower parasitic cross talk as compared to dielectric materials whose dielectric constant is greater than 4.0.

The first interconnect dielectric material layer 12 may be formed by a deposition process such as, for example, chemical vapor deposition (CVD), plasma enhanced chemical vapor deposition (PECVD) or spin-on coating. The first interconnect dielectric material layer 12 may have a thickness from 50 nm to 250 nm. Other thicknesses that are lesser than 50 nm, and greater than 250 nm can also be employed in the present application.

After providing the first interconnect dielectric material layer 12, at least one opening (not specifically shown) is formed into the first interconnect dielectric material layer 12; each opening will house a first electrically conductive structure 16 and, if present, the first diffusion barrier liner 14. The at least one opening in the first interconnect dielectric material layer 12 is a line opening. The at least one opening may be formed by lithography and etching.

In some embodiments, a first diffusion barrier material is then formed within the at least one opening and on an exposed topmost surface of the first interconnect dielectric material layer 12; the first diffusion barrier material will provide the first diffusion barrier liner 14 mentioned above. The first diffusion barrier material may include Ta, TaN, Ti, TiN, Ru, RuN, RuTa, RuTaN, W, WN or any other material that can serve as a barrier to prevent a conductive material from diffusing there through. The thickness of the first diffusion barrier material may vary depending on the deposition process used as well as the material employed. In some embodiments, the first diffusion barrier material may have a thickness from 2 nm to 50 nm; although other thicknesses for the diffusion barrier material are contemplated and can be employed in the present application as long as the first diffusion barrier material does not entirely fill the opening. The first diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the first diffusion barrier material. In cases in which the conductive material to be subsequently and directly formed on the first diffusion barrier material, the optional plating seed layer is not needed. The optional plating seed layer is employed to selectively promote subsequent electroplating of a preselected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

Next, a first electrically conductive metal or metal alloy having a first bulk resistivity is formed into each opening and, if present, atop the first diffusion barrier material. Bulk resistivity (or volume resistivity) is a constant value for a certain material at a certain environment (typically measured at 20° C.). The bulk resistivity is a measure of the resistivity across a defined thickness of the material. The first electrically conductive metal or metal alloy provides the first electrically conductive structure 16 of the present application. The first bulk resistivity is typically within a range from 1.5 $\mu\Omega\cdot cm$ to 3.0 $\mu\Omega\cdot cm$, wherein $\mu\Omega$ equals microohms. The first electrically conductive metal or metal alloy having the first bulk resistivity may be composed of copper (Cu), aluminum (Al), tungsten (W), or an alloy thereof such as, for example, a Cu—Al alloy. The first electrically conductive metal or metal alloy can be formed utilizing a deposition process such as, for example, CVD, PECVD, sputtering, chemical solution deposition or plating. In one embodiment, a bottom-up plating process is employed in forming the first electrically conductive metal or metal alloy. In some embodiments, the first electrically conductive metal or metal alloy is formed above the topmost surface of the first interconnect dielectric material layer 12.

Following the deposition of the first electrically conductive metal or metal alloy, a planarization process such as, for example, chemical mechanical polishing (CMP) and/or grinding, can be used to remove all electrically conductive metal or metal alloy (i.e., overburden material) that is present outside each of the openings forming the first electrically conductive structure 16 shown in FIG. 1. The planarization stops on a topmost surface of the first interconnect dielectric material layer 12. Thus, and if present, the planarization process also removes the first diffusion barrier material from the topmost surface of the first interconnect dielectric material layer 12. The remaining portion of the first diffusion barrier material that is present in the at least one opening is referred to herein as the first diffusion barrier liner 14, while the remaining first electrically conductive metal or metal alloy that is present in the at least one opening may be referred to as the first electrically conductive structure 16. Collectively, the first interconnect dielectric material layer 12, each optional first diffusion barrier liner 14, and each first electrically conductive structure 16 define the lower interconnect level, $L_n$, of an interconnect structure of the present application. Each first electrically conductive structure 16 may be referred to herein as a first electrically conductive line feature, i.e., $M_x$.

Next, and in some embodiments, capping layer 18 can be formed on the physically exposed topmost surface of the lower interconnect level, $L_n$, of the present application. In some embodiments, capping layer 18 can be omitted. When present, the capping layer 18 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The capping material that provides the capping layer 18 may be formed utilizing a deposition process such as, for example, CVD, PECVD, ALD, chemical solution deposition or evaporation. When present, capping layer 18 may have a thickness from 10 nm to 100 nm. Other thicknesses that are lesser than 10 nm, or greater than 100 nm may also be used as the thickness of the capping layer 18.

Next, the second interconnect dielectric material layer 20 (without the combined via/line opening) is formed above the lower interconnect level, $L_n$. The second interconnect dielectric material layer 20 may include one of the interconnect dielectric materials mentioned above for the first interconnect dielectric material layer 12. In some embodiments, the second interconnect dielectric material layer 20 includes a same interconnect dielectric material as the first interconnect dielectric material layer 12. In other embodiments, the second interconnect dielectric material layer 20 includes a different interconnect dielectric material than the first interconnect dielectric layer 12. The second interconnect dielectric material layer 20 may be porous or non-porous, have a thickness within the thickness range of the first interconnect dielectric material layer 12, and be formed utilizing one of the deposition processes used in providing the first interconnect dielectric material layer 12.

Next, a combined via/line opening 22 (opening 22 can also be referred to herein as a dual damascene opening that includes a via portion located beneath a line portion) can then be formed into the second interconnect dielectric material layer 20. During or, after, the formation of the via portion of the combined via opening 22, the capping layer 18 can be opened as is shown in FIG. 1 to expose a portion of the topmost surface of the at least one first electrically conductive structure 16 that is embedded in the first interconnect dielectric material layer 12. The combined via/line opening 22 is formed utilizing a dual damascene process as known in the art.

Figure 2:
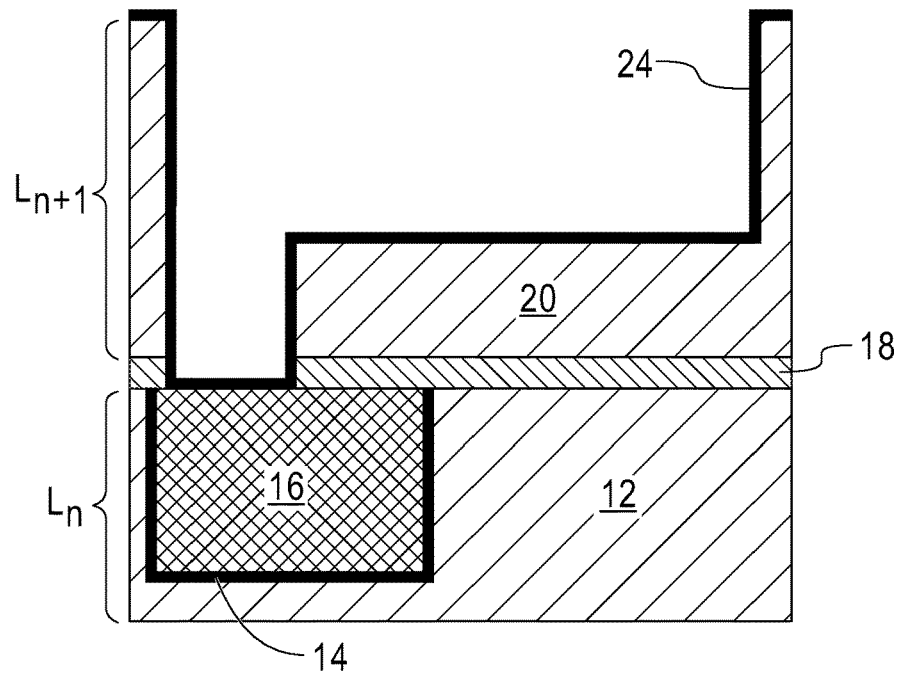
FIG. 2 is a cross sectional view of the exemplary semiconductor structure of FIG. 1 after forming a diffusion barrier material layer in the combined via/line opening and on a topmost surface of the second interconnect dielectric material layer.

Referring now to FIG. 2, there is illustrated the exemplary semiconductor structure of FIG. 1 after forming a diffusion barrier material layer 24 in the combined via/line opening 22 and on a topmost surface of the second interconnect dielectric material layer 20. As is shown, the diffusion barrier material layer 24 is a continuous layer that does not completely fill in the combined via/line opening 22 that is formed in the second interconnect dielectric material layer 20. The diffusion barrier material layer 24 is present on physically exposed surfaces of the second interconnect dielectric material layer 20, the capping layer 18, if present, and the first electrically conductive structure 16 that is embedded in the first interconnect dielectric material layer 12.

The diffusion barrier material layer 24 includes a second diffusion barrier material which may include one of the diffusion barrier materials mentioned above for the first diffusion barrier material that provides first diffusion barrier liner 14. In one embodiment, the first and second diffusion barrier materials may be composed of a same diffusion barrier material. In another embodiment, the first and second diffusion barrier materials are composed of different diffusion barrier materials. The second diffusion barrier material that provides diffusion barrier material layer 24 may be formed utilizing one of the deposition processes mentioned above for forming the first diffusion barrier material that provides the first diffusion barrier liner 14, and the second diffusion barrier material that provides diffusion barrier material layer 24 may have a thickness within the thickness range mentioned above for the first diffusion barrier material that provides the first diffusion barrier liner 14.

Figure 3:
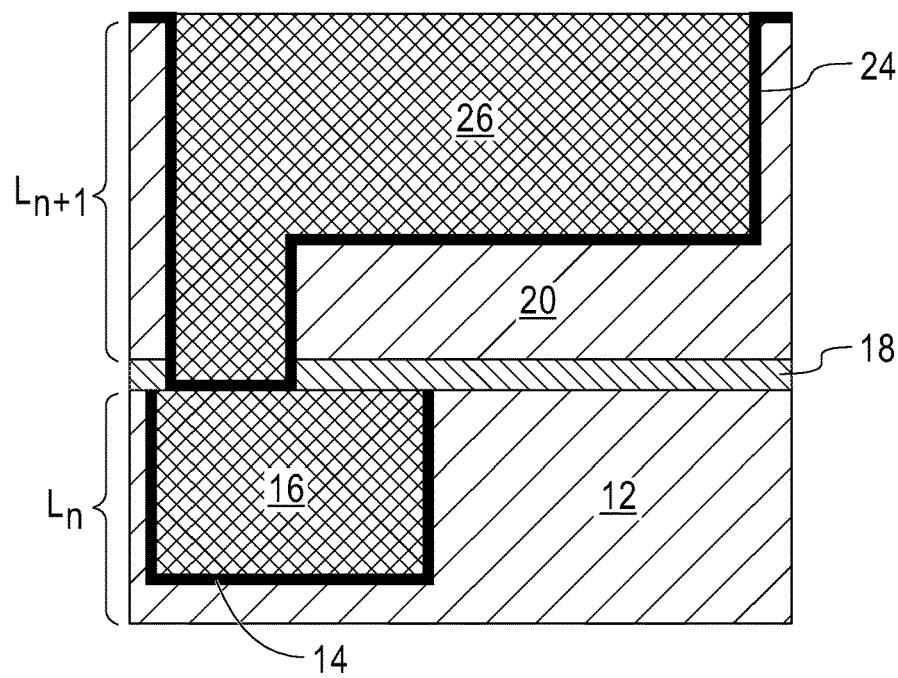
FIG. 3 is a cross sectional view of the exemplary semiconductor structure of FIG. 2 after forming an electrically conductive metal or metal alloy material in the combined via/line opening.

Referring now to FIG. 3, there is illustrated the exemplary semiconductor structure of FIG. 2 after forming an electrically conductive metal or metal alloy material 26 in the combined via/line opening 22. The electrically conductive metal or metal alloy material 26 has the first bulk resistivity mentioned above. The electrically conductive metal or metal alloy material 26 thus may include one of the electrically conductive metals or metal alloys that provide the first electrically conductive structure 16. In one example, the electrically conductive metal or metal alloy material 26 and the first electrically conductive structure both comprise copper or a copper-aluminum alloy.

The electrically conductive metal or metal alloy material 26 may be formed utilizing one of the techniques mentioned above for providing the electrically conductive metal or metal alloy of the first electrically conductive structure 16. Alternatively, the electrically conductive metal or metal alloy material 26 may be formed by deposition, followed by a reflow anneal. In some embodiments, a planarization process such as, for example, chemical mechanical polishing may follow the deposition (and optional reflow anneal) of the electrically conductive metal or metal alloy material 26.

Figure 4:
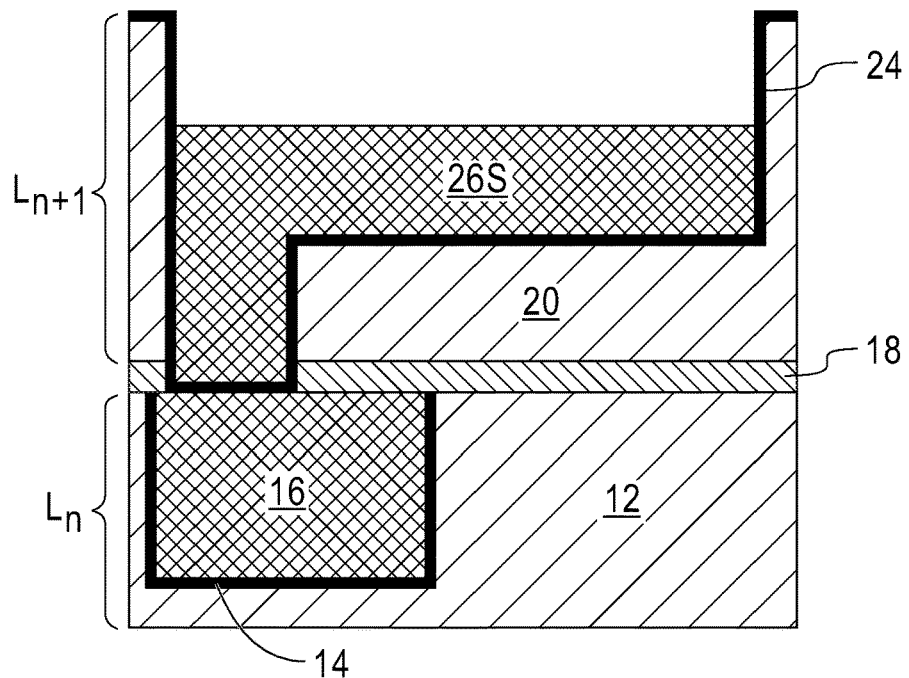
FIG. 4 is a cross sectional view of the exemplary semiconductor structure of FIG. 3 after recessing the electrically conductive metal or metal alloy material in the combined via/line opening to provide a second electrically conductive structure that includes a combined electrically conductive via feature and an electrically conductive line feature.

Referring now to FIG. 4, there is illustrated the exemplary semiconductor structure of FIG. 3 after recessing the electrically conductive metal or metal material 26 in the combined via/line opening 22 to provide a second electrically conductive structure 26S that includes a combined electrically conductive via feature (present in the via portion of the combined via/line opening 22) and an electrically conductive line feature (present in a lower portion of the line portion of the combined via/line opening 22). The recessing may be performed utilizing an etching process that is selective in removing the electrically conductive metal or metal alloy material 26.

In some embodiments of the present application, the exemplary structure shown in FIG. 4 can be formed without first providing the exemplary structure shown in FIG. 3. For example, a reflow anneal process may be used to provide the second electrically conductive structure 26S directly to the exemplary structure of FIG. 2.

The electrically conductive via feature that is present in the via portion of the combined via/line opening 22 (and constitutes a lower portion of the second electrically conductive structure 26S) may be referred to herein as a first electrically conductive via feature, $V_x$, while the electrically conductive line feature present in a lower portion of the line portion of the combined via/line opening 22 (and constitutes an upper portion of the second electrically conductive structure 26S) may be referred to as a second electrically conductive line feature, $M_{x+1}$. The first electrically conductive via feature and the second electrically conductive line feature are of unitary construction (i.e., they are a single piece made from the same electrically conductive metal or metal alloy). In accordance with the present application, the first electrically conductive via feature is self-aligned perpendicularly to, and along the direction of, the second electrically conductive line feature.

Figure 5:
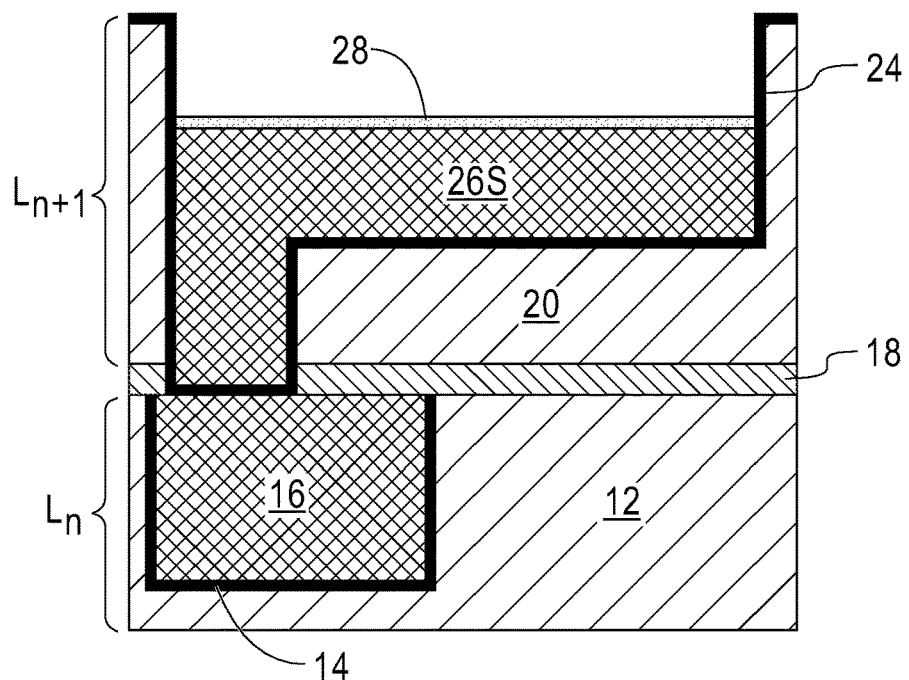
FIG. 5 is a cross sectional view of the exemplary semiconductor structure of FIG. 4 after forming a metal liner on a topmost surface of the second electrically conductive structure.

Referring now to FIG. 5, there is illustrated the exemplary semiconductor structure of FIG. 4 after forming a metal liner 28 on a topmost surface of the second electrically conductive structure 26S. As is shown, the metal liner 28 is formed continuously on the topmost surface of the second electrically conductive structure 26S.

The metal liner 28 is composed of a metal, metal nitride or metal alloy that differs in composition from the second electrically conductor structure 26S. Examples of materials than can be used as the metal liner 28 include, but are not limited to, ruthenium (Ru), cobalt (Co), tantalum (Ta), titanium (Ti), or nitrides and alloys thereof. In some embodiments, a single material may be used to provide the metal liner 28. In other embodiments, a multilayered stack such as, for example, Ta/TaN, may be used in providing the metal liner 28.

The metal liner 28 may be formed utilizing a selective or blanket layer deposition process. In a selective deposition process, the metal liner 28 is formed only upon the second electrically conductive structure 26S. In a blanket layer deposition process, the metal, metal nitride, or metal alloy that provides the metal liner 28 is formed everywhere and a patterning process is then used to provide the metal liner 28. The metal liner 28 may have a thickness from 5 nm to 20 nm. Other thicknesses besides the thickness range mentioned herein can be used as the thickness of the metal liner 28 as long as the metal liner 28 does not completely fill in the upper portion of the line opening of the combined via/line opening 22.

Figure 6:
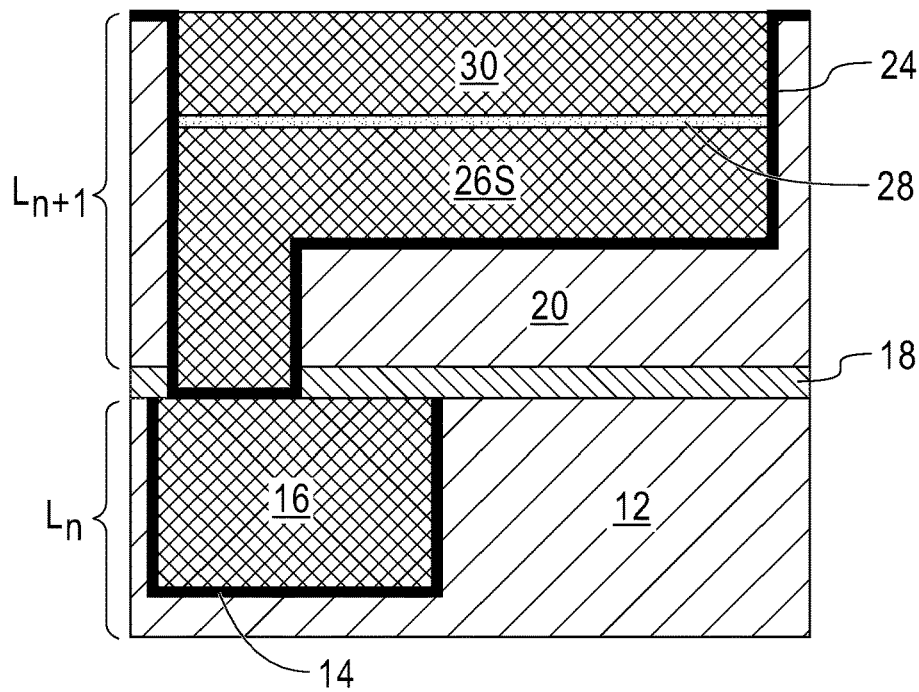
FIG. 6 is a cross sectional view of the exemplary semiconductor structure of FIG. 5 after forming another electrically conductive metal or metal alloy material on the metal liner and within an upper portion of the combined via/line opening.

Referring now to FIG. 6, there is illustrated the exemplary semiconductor structure of FIG. 5 after forming another electrically conductive metal or metal alloy material 30 on the metal liner 28 and within an upper portion of the combined via/line opening 22.

In one embodiment, the another electrically conductive metal or metal alloy material 30 has the first bulk resistivity mentioned above. Thus, and in such an embodiment, the another electrically conductive metal or metal alloy material 30 may be composed of may be composed of copper (Cu), aluminum (Al), tungsten (W), or an alloy thereof such as, for example, a Cu—Al alloy.

In another embodiment, the another electrically conductive metal or metal alloy material 30 has a second bulk resistivity that is greater than the first bulk resistivity. The second bulk resistivity is typically within a range from to 3.5 $\mu\Omega\cdot cm$ to 8.0 $\mu\Omega\cdot cm$. In such an embodiment, the another electrically conductive metal or metal alloy material 30 may include cobalt (Co), ruthenium (Ru), rhodium (Rh), iridium (Ir), tungsten (W), nickel (Ni) or alloys thereof.

The another electrically conductive metal or metal alloy material 30 can be formed utilizing a deposition process such as, for example, CVD, PECVD, sputtering, chemical solution deposition or plating. In one embodiment, a bottom-up plating process is employed in forming the another electrically conductive metal or metal alloy. Alternatively, a reflow anneal process can be used to form the another electrically conductive metal or metal alloy material 30.

Figure 7:
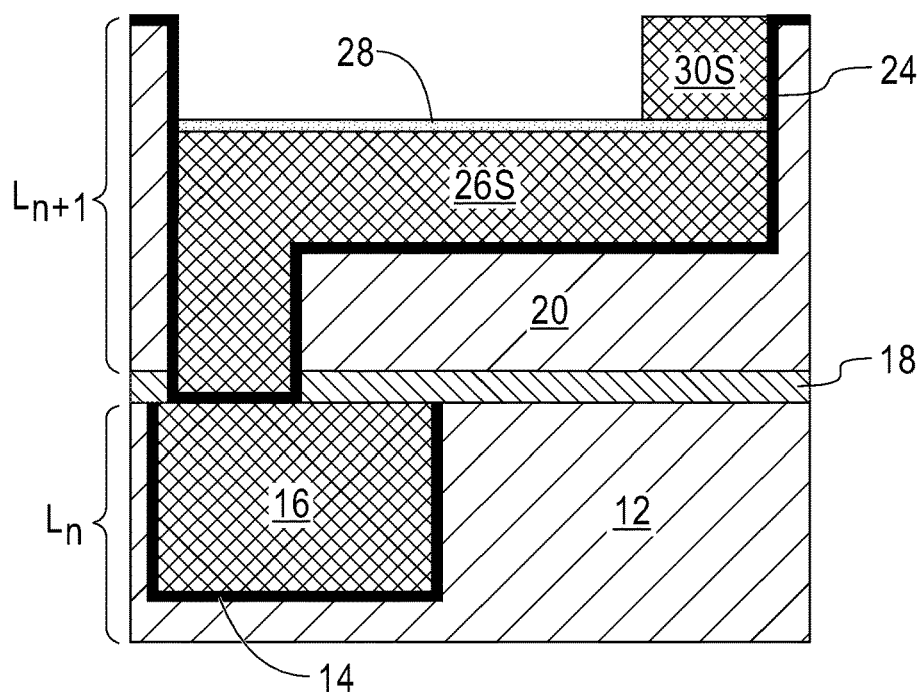
FIG. 7 is a cross sectional view of the exemplary semiconductor structure of FIG. 6 after patterning the another electrically conductive metal or metal alloy material to provide another electrically conductive via feature.
Figure 10:
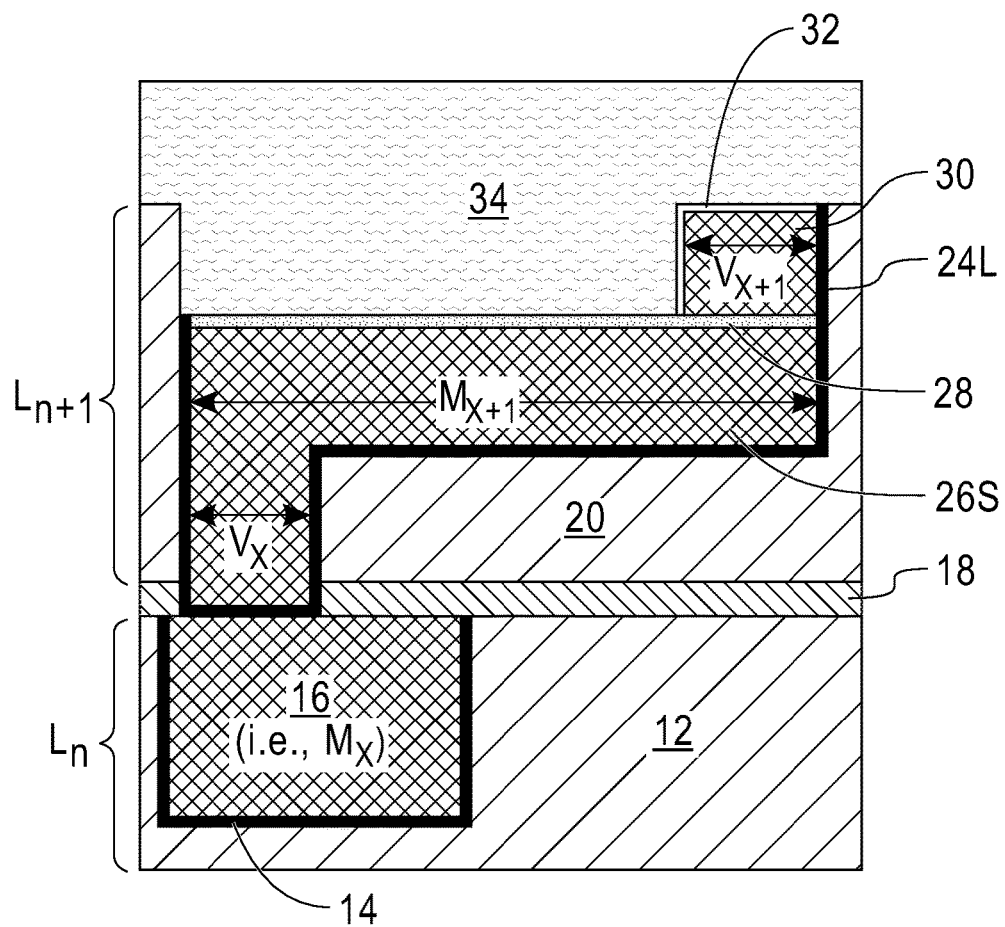
FIG. 10 is a cross sectional view of the exemplary semiconductor structure of FIG. 9 after forming a third interconnect dielectric material layer.

Referring now to FIG. 7, there is illustrated the exemplary semiconductor structure of FIG. 6 after patterning the another electrically conductive metal or metal alloy material 30 to provide another electrically conductive via feature 30S. Patterning may be achieved by lithography and etching. In the present application, the another electrically conductive via feature 30S is self-aligned (perpendicular to, and along the line direction of, the second electrically conductive structure 26S and provides a topography to the resultant BEOL interconnect structure (as shown in FIG. 10).

The another electrically conductive via feature 30S is embedded with the upper portion of the line portion of the combined via/line opening 22 and thus is embedded in the second interconnect dielectric material layer 20. The another electrically conductive via feature 30S may have a height from 10 nm to 300 nm, a width from 10 nm to 150 nm, and a length from 10 nm to 150 nm. The another electrically conductive via feature 30S that is present in the upper portion of the line portion of the combined via/line opening 22, may be referred to herein as a second electrically conductive via feature, $V_{x+1}$. The second electrically conductive via feature, $V_{x+1}$, is self-aligned perpendicularly to, and along the direction of, the second electrically conductive line feature, $M_{x+1}$.

Figure 8:
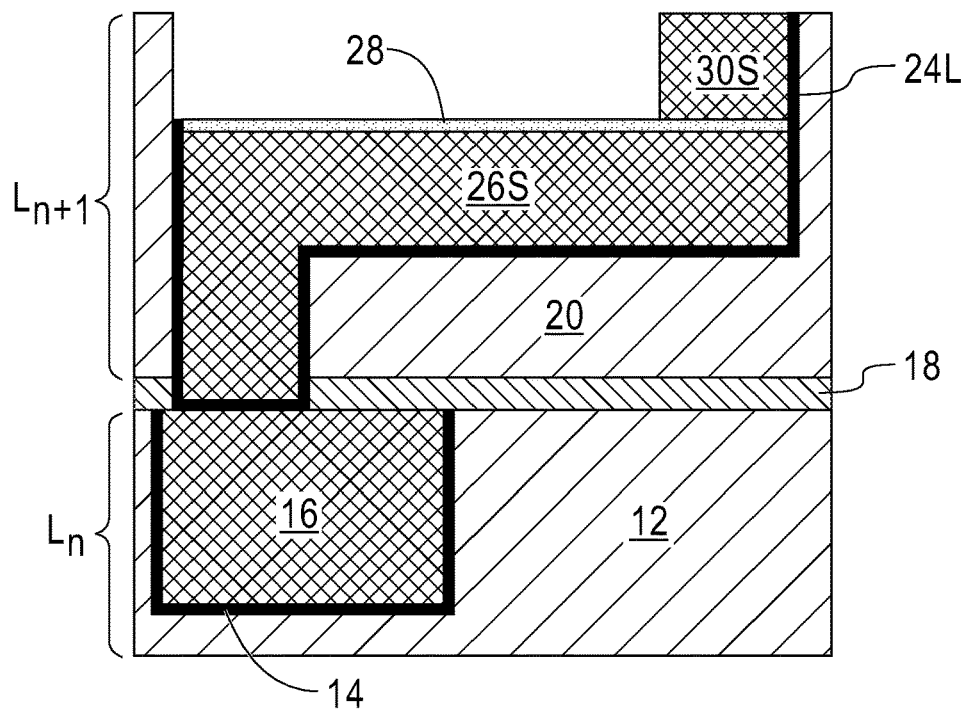
FIG. 8 is a cross sectional view of the exemplary semiconductor structure of FIG. 7 after removing physically exposed portions of the diffusion barrier material layer.

Referring now to FIG. 8, there illustrated of the exemplary semiconductor structure of FIG. 7 after removing physically exposed portions of the diffusion barrier material layer 24. In some embodiments and as illustrated, the diffusion barrier material layer 24 is removed from the topmost surface of the second interconnect dielectric material layer 20 and along one of the sidewalls of the upper portion of the line portion of the combined via/line opening 22; the diffusion barrier material layer 24 along the other sidewall that is protected by the another electrically conductive via feature 30S is not removed. The remaining diffusion barrier layer 24 may be referred to herein as a second diffusion barrier liner 24L. In some embodiments (not shown), the diffusion barrier material layer 24 is only removed from the topmost surface of the second interconnect dielectric material layer 20.

The removal of the physically exposed portions of the diffusion barrier material layer 24 may be performed utilizing an etching process that is selective in removing the diffusion barrier material that provides the diffusion barrier material layer 24. In some embodiments, a direction reactive ion etching process can be used to remove physically exposed portions of the diffusion barrier material layer 24.

Figure 9:
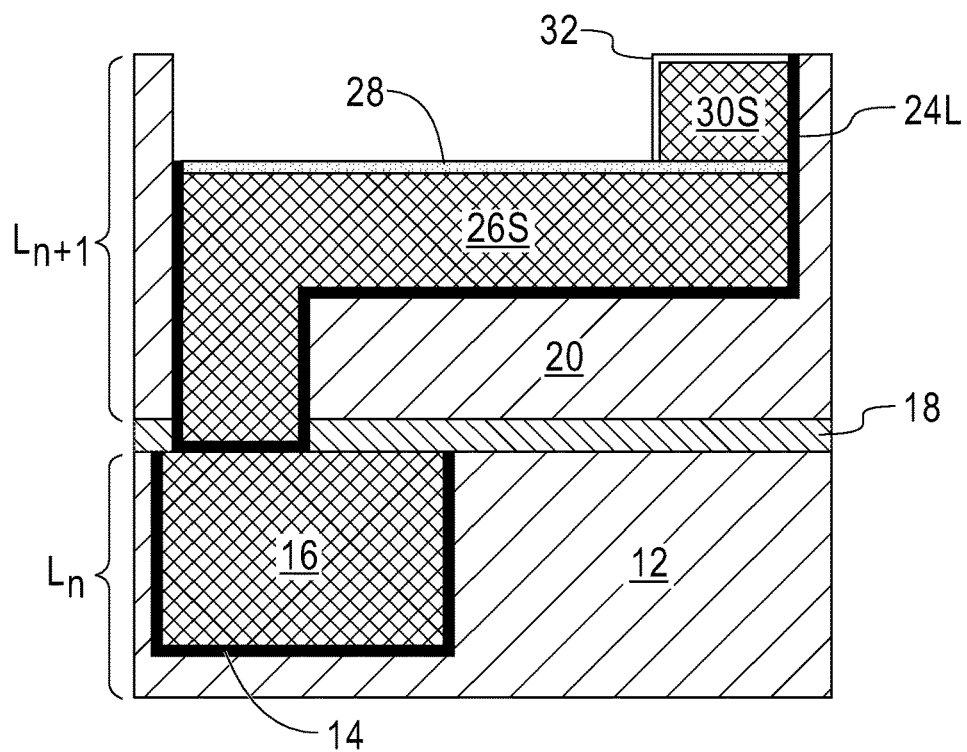
FIG. 9 is a cross sectional view of the exemplary semiconductor structure of FIG. 8 after forming another metal liner.

Referring now to FIG. 9, there is illustrated the exemplary semiconductor structure of FIG. 8 after forming another metal liner 32; the formation of the another metal liner 32 is required when the another electrically conductive via feature 30S is composed of a metal or metal alloy having the first bulk resistivity. In some embodiments in which the another electrically conductive via feature 30S is composed of a metal or metal alloy having the second bulk resistivity, the formation of the another metal liner 32 may be omitted.

The another metal liner 32 may be composed of one of the materials mentioned above in forming the metal liner 28. In some embodiments, the another metal liner 32 and the metal liner 28 are both composed of a same material. In other embodiments, the another metal liner 32 and the metal liner 28 are composed of different materials.

The another metal liner 32 may be formed utilizing one of the techniques mentioned above in forming metal liner 28. The another metal liner 32 may have a thickness within the thickness range mentioned above for the metal liner 28. As is shown, the another metal liner 32 is formed on physically exposed surfaces of the another electrically conductive via feature 30S.

Referring now to FIG. 10, there is illustrated the exemplary semiconductor structure of FIG. 9 after forming a third interconnect dielectric material layer 34. As is shown, the third interconnect dielectric material 34 is formed in a remaining space within the upper portion of the line portion of the combined via/line opening 22 and laterally adjacent to the another electrically conductive via feature 30S as well as atop the another electrically conductive via feature 30S and atop the second interconnect dielectric material layer 20.

The third interconnect dielectric material layer 34 may include one of the interconnect dielectric materials mentioned above for the first interconnect dielectric material layer 12. In some embodiments, the third interconnect dielectric material layer 34 includes a same interconnect dielectric material as the second interconnect dielectric material layer 20. In yet other embodiments, the third interconnect dielectric material layer 34 includes a different interconnect dielectric material than the second interconnect dielectric layer 34. The third interconnect dielectric material layer 34 may be porous or non-porous, have a thickness within the thickness range of the first interconnect dielectric material layer 12, and be formed utilizing one of the deposition processes used in providing the first interconnect dielectric material layer 12.

FIG. 10 shows an exemplary interconnect structure of the present application which includes a lower interconnect level, $L_n$, comprising a first interconnect dielectric material layer 12 having a first electrically conductive line feature, $M_x$ (i.e., electrically conductive structure 16), embedded therein. The structure further includes an upper interconnect level, $L_{n+1}$, located above the lower interconnect level, $L_n$, and comprising a second interconnect dielectric material layer 20 having a first electrically conductive via feature, $V_x$ (i.e. a lower portion of electrically conductive structure 26S), a second electrically conductive line feature, $M_{x+1}$ (i.e., an upper lower portion of electrically conductive structure 26S), and a second electrically conductive via feature, $V_{x+1}$ (i.e. electrically conductive structure 30), stacked one atop the other, and embedded in the second interconnect dielectric material layer 20, wherein the first and second electrically conductive via features, $V_x$ and $V_{x+1}$, are self-aligned perpendicularly to, and along the direction of, the second electrically conductive line feature, $M_{x+1}$. A third interconnect dielectric material layer 34 is present that has a lower portion embedded in the second interconnect dielectric material layer 20 and laterally adjacent the second electrically conductive via feature, $V_{n+1}$, and an upper portion that is located above the second interconnect dielectric material layer 20 and the second electrically conductive via feature, $V_{x+1}$.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure comprising:
   a lower interconnect level comprising a first interconnect dielectric material layer having a first electrically conductive line feature embedded therein;
   an upper interconnect level located above the lower interconnect level and comprising a second interconnect dielectric material layer having a first electrically conductive via feature, a second electrically conductive line feature, and a second electrically conductive via feature stacked one atop the other, and embedded in the second interconnect dielectric material layer, wherein the first and second electrically conductive via features are self-aligned perpendicularly to, and along the direction of, the second electrically conductive line feature;
a third interconnect dielectric material layer having a lower portion embedded in the second interconnect dielectric material layer and laterally adjacent the second electrically conductive via feature, and an upper portion that is located above the second interconnect dielectric material layer and the second electrically conductive via feature; and
a first metal liner located on an entirety of a topmost surface of the second electrically conductive line feature and entirely separating the second electrically conductive line feature from the second electrically conductive via feature and from the third interconnect dielectric material layer.

2. The interconnect structure of claim 1, further comprising a second metal liner located on a sidewall and a topmost surface of the second electrically conductive via feature.

3. The interconnect structure of claim 2, wherein the first electrically conductive line feature, the first electrically conductive via feature, the second electrically conductive line feature, and the second electrically conductive via feature comprise an electrically conductive metal or metal alloy having a first bulk resistivity from 1.5 μΩ·cm to 3.0 μΩ·cm.

4. The interconnect structure of claim 1, wherein the first electrically conductive line feature, the first electrically conductive via feature, and the second electrically conductive line feature, comprise an electrically conductive metal or metal alloy having a first bulk resistivity from 1.5 μΩ·cm to 3.0 μΩ·cm, and the second electrically conductive via feature comprise an electrically conductive metal or metal alloy having a second bulk resistivity that is greater than the first bulk resistivity and is from 3.5 μΩ·cm to 8.0 μΩ·cm.

5. The interconnect structure of claim 4, wherein the metal or metal alloy having the second bulk resistivity comprises cobalt (Co), ruthenium (Ru), rhodium (Rh), iridium (Ir), tungsten (W), nickel (Ni) or alloys thereof.

6. The interconnect structure of claim 1, wherein the first electrically conductive via feature and the second electrically conductive line feature are of unitary construction.

7. The interconnect structure of claim 1, further comprising a dielectric cap located between the lower and upper interconnect levels.

8. The interconnect structure of claim 1, wherein a diffusion barrier liner is present between the first electrically conductive line feature and the first interconnect dielectric material layer, and another diffusion barrier liner is present between the first electrically conductive line feature, the first electrically conductive via feature, the second electrically conductive line feature, and the second electrically conductive via feature and the second interconnect dielectric material layer.

9. The interconnect structure of claim 1, wherein the third interconnect dielectric material layer comprises a different interconnect dielectric material than the second interconnect dielectric material layer.

10. A method of forming an interconnect structure, the method comprising:
forming a lower interconnect level comprising a first interconnect dielectric material layer having a first electrically conductive line feature embedded therein;
forming an upper interconnect level above the lower interconnect level and comprising a second interconnect dielectric material layer having a first electrically conductive via feature, a second electrically conductive line feature, and a second electrically conductive via feature stacked one atop the other, and embedded in the second interconnect dielectric material layer, wherein the first and second electrically conductive via features are self-aligned perpendicularly to, and along the direction of, the second electrically conductive line feature and wherein a first metal liner is located on an entirety of a topmost surface of the second electrically conductive line feature and entirely separating the second electrically conductive line feature from the second electrically conductive via feature; and
forming a third interconnect dielectric material layer having a lower portion embedded in the second interconnect dielectric material layer and laterally adjacent the second electrically conductive via feature, and an upper portion that is located above the second interconnect dielectric material layer and the second electrically conductive via feature, wherein the lower portion of the third interconnect dielectric material layer has a surface that is in direct physical contact with a portion of the first metal liner.

11. The method of claim 10, wherein the forming of the upper interconnect level comprises:
forming a combined via/line opening in the second interconnect dielectric material layer;
forming a recessed electrically conductive metal or metal alloy material in the combined via/line opening to provide the first electrically conductive via feature in a via portion of the combined via/line opening and the second electrically conductive line feature in a lower line portion of the combined via/line opening; and
forming the second electrically conductive via feature in an upper portion of the line portion of the combined via/line opening.

12. The method of claim 11, wherein the forming of the second electrically conductive via feature comprises providing an electrically conductive metal or metal alloy in the upper portion of the line portion of the combined via/line opening, and patterning the electrically conductive metal or metal alloy.

13. The method of claim 11, further comprising forming a second metal liner on physically exposed surfaces of the second electrically conductive via feature prior to the forming of the third interconnect dielectric material layer.

14. The method of claim 10, wherein the first electrically conductive line feature, the first electrically conductive via feature, the second electrically conductive line feature, and the second electrically conductive via feature comprise an electrically conductive metal or metal alloy having a first bulk resistivity from 1.5 μΩ·cm to 3.0 μΩ·cm.

15. The method of claim 10, wherein the first electrically conductive line feature, the first electrically conductive via feature, and the second electrically conductive line feature, comprise an electrically conductive metal or metal alloy having a first bulk resistivity from 1.5 μΩ·cm to 3.0 μΩ·cm, and the second electrically conductive via feature comprise an electrically conductive metal or metal alloy having a second bulk resistivity that is greater than the first bulk resistivity and is from 3.5 μΩ·cm to 8.0 μΩ·cm.

16. The method of claim 15, wherein the metal or metal alloy having the second bulk resistivity comprises cobalt (Co), ruthenium (Ru), rhodium (Rh), iridium (Ir), tungsten (W), nickel (Ni) or alloys thereof.

17. The method of claim 10, further comprising forming a dielectric cap on the lower interconnect level prior to forming the upper interconnect level.

18. The method of claim 10, wherein the third interconnect dielectric material layer comprises a different interconnect dielectric material than the second interconnect dielectric material layer.

* * * * *